(12) United States Patent
Lu et al.

(10) Patent No.: US 11,785,778 B2
(45) Date of Patent: Oct. 10, 2023

(54) FERROELECTRIC MEMORY AND MEMORY ARRAY DEVICE WITH MULTIPLE INDEPENDENTLY CONTROLLED GATES

(71) Applicant: NATIONAL CHENG KUNG UNIVERSITY, Tainan (TW)

(72) Inventors: Darsen Duane Lu, Tainan (TW); Chi-Jen Lin, Changhua County (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 266 days.

(21) Appl. No.: 17/317,766

(22) Filed: May 11, 2021

(65) Prior Publication Data
US 2022/0278129 A1    Sep. 1, 2022

(30) Foreign Application Priority Data
Feb. 26, 2021    (TW) ................................. 110106950

(51) Int. Cl.
*H10B 51/20*    (2023.01)
*H01L 29/78*    (2006.01)
(Continued)

(52) U.S. Cl.
CPC ............ *H10B 51/20* (2023.02); *G11C 11/223* (2013.01); *G11C 11/2275* (2013.01); *H01L 29/66795* (2013.01); *H01L 29/7851* (2013.01); *H01L 29/7855* (2013.01); *H01L 29/78391* (2014.09); *H10B 51/10* (2023.02); *H10B 51/30* (2023.02)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 2924/1441; H01L 29/78391; H01L 29/516; H01L 29/6684; H01L 29/7855; H10B 51/00–50; G11C 11/223; G11C 11/5657
See application file for complete search history.

(56) References Cited

U.S. PATENT DOCUMENTS

2007/0145483 A1* 6/2007 Ono ................. H01L 29/6684
                                                      257/E21.663
2021/0167073 A1* 6/2021 Shivaraman ........ H01L 29/6684
(Continued)

*Primary Examiner* — Younes Boulghassoul
(74) *Attorney, Agent, or Firm* — Maschoff Brennan

(57) ABSTRACT

A multi-gate ferroelectric memory comprises a fin-shaped channel layer, a front ferroelectric layer disposed on one side of the fin-shaped channel layer, a back ferroelectric layer disposed on another side of the fin-shaped channel layer, a front gate attached to the front ferroelectric layer and away from the fin-shaped channel layer, wherein the front gate is configured to connect a word line, and a back gate attached to the back ferroelectric layer and away from the fin-shaped channel layer, wherein the back gate is configured to connect a bit line. The present disclosure further discloses a memory array device, comprises a plurality of the multi-gate ferroelectric memories arranged as an array, a plurality of word lines and a plurality of bit lines.

13 Claims, 13 Drawing Sheets

(51) Int. Cl.
*H01L 29/66* (2006.01)
*H10B 51/10* (2023.01)
*H10B 51/30* (2023.01)
*G11C 11/22* (2006.01)

(56) References Cited

U.S. PATENT DOCUMENTS

2021/0376108 A1* 12/2021 Doornbos ............. H01L 29/516
2022/0393031 A1* 12/2022 Ando ................ H01L 29/66484

* cited by examiner

FERROELECTRIC MEMORY AND MEMORY ARRAY DEVICE WITH MULTIPLE INDEPENDENTLY CONTROLLED GATES

CROSS-REFERENCE TO RELATED APPLICATIONS

This non-provisional application claims priority under 35 U.S.C. § 119(a) on Patent Application No(s). 110106950 filed in Republic of China (ROC) on Feb. 26, 2021, the entire contents of which are hereby incorporated by reference.

BACKGROUND

1. Technical Field

This disclosure relates to a multi-gate ferroelectric memory and memory array device.

2. Related Art

The existing ferroelectric memory array mainly has 1T1S structure (one transistor and one memory element). In a memory cell, a transistor is used as a selection element for selecting whether the state of the memory cell should be changed. According to existing technology, a plurality of memory cells may be arranged as a memory array. An array operation may be completed by inputting a voltage into the array, then a current may be collected and analyzed to complete the massively parallel operation. Therefore, the existing memory array may be applied to circuits of neural network. However, as described above, the existing ferroelectric memory array requires two elements to implement a memory cell to be able to select the storage state, which leads to increase in the surface area of the memory array. Further, although current Flash (non-ferroelectric) technology, which adopts a three-layer structure of silicon dioxide/silicon nitride/silicon dioxide as the insulation layer of the memory cell and changes the storage state of the memory cell through means of quantum tunneling or hot carriers, requires only one element to implement a memory cell, the speed of changing the storage state of the memory cell is unable to be effectively improved.

SUMMARY

Accordingly, this disclosure provides a multi-gate ferroelectric memory and memory array device.

According to one or more embodiment of this disclosure, a multi-gate ferroelectric memory comprises: a fin-shaped channel layer; a front ferroelectric layer disposed on one side of the fin-shaped channel layer; a back ferroelectric layer disposed on another side of the fin-shaped channel layer; a front gate attached to the front ferroelectric layer and away from the fin-shaped channel layer, wherein the front gate is configured to connect a word line; and a back gate attached to the back ferroelectric layer and away from the fin-shaped channel layer, wherein the back gate is configured to connect a bit line.

According to one or more embodiment of this disclosure, a memory array device comprises: a plurality of the multi-gate ferroelectric memories arranged as an array; a plurality of word lines, with each of the word lines connecting the front gates of part of the multi-gate ferroelectric memories, wherein the part of the multi-gate ferroelectric memories connected to a same one of the word lines is arranged along a first direction of the array; and a plurality of bit lines, with each of the bit lines connecting the back gates of part of the multi-gate ferroelectric memories, wherein the part of the multi-gate ferroelectric memories connected to a same one of the bit lines is arranged along a second direction of the array.

In view of the above description, according to the multi-gate ferroelectric memory and the memory array device of the present disclosure, the storage state of the memory may be selectively changed by only using one element, and the size and cost of the memory array device may be reduced. Further, more memory may be disposed under the same area, and at the same time a larger storage space may be generated to store more data. Each of the memory in the memory array device may operate independently. In addition, with the ferroelectric material, the storage state of the memory may be altered faster and the memory may operate under a lower working voltage.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
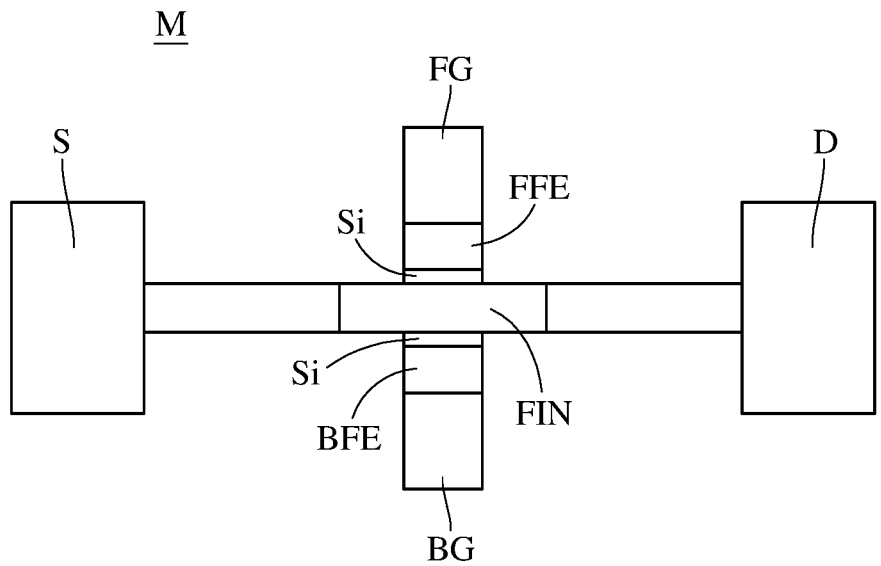
FIG. 1 is a schematic diagram of the multi-gate ferroelectric memory according to an embodiment of the present disclosure.

Please refer to FIG. 1 which is a schematic diagram of the multi-gate ferroelectric memory according to an embodiment of the present disclosure. The schematic diagram shown in FIG. 1 is a top view of the multi-gate ferroelectric memory. The multi-gate ferroelectric memory M of the present disclosure preferably comprises a fin-shaped channel layer FIN, a front ferroelectric layer FFE, a back ferroelectric layer BFE, a front gate FG, and a back gate BG. Further, the multi-gate ferroelectric memory M has a source S and a drain D, wherein the multi-gate ferroelectric memory M is, for example, a non-volatile memory.

The front ferroelectric layer FFE is disposed on one side of the fin-shaped channel layer FIN, the back ferroelectric layer BFE is disposed on another side of the fin-shaped channel layer FIN. The front gate FG is attached to the front ferroelectric layer FFE and is located on the side of the front ferroelectric layer FFE that is away from the fin-shaped channel layer FIN; the back gate BG is attached to the back ferroelectric layer BFE and is located on the side of the back ferroelectric layer BFE that is away from the fin-shaped channel layer FIN. The front gate FG is configured to connect to a word line, the back gate BG is configured to connect to a bit line, wherein the front gate FG and the back gate BG contain one or both of titanium nitride (TiN) and tantalum nitride (TaN), or highly doped silicon. The front gate FG and the back gate BG may also be any metal, the present disclosure does not limit the composition of the front gate FG and the back gate BG.

Figure 2:
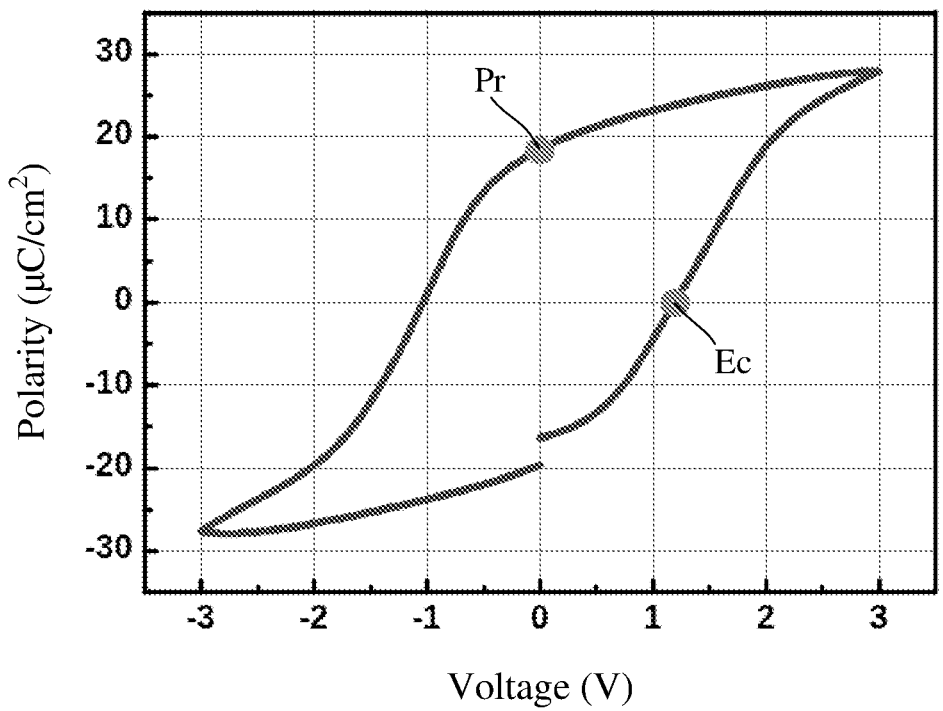
FIG. 2 shows a measurement result of the hysteresis characteristics of a ferroelectric material.

Specifically, the multi-gate ferroelectric memory M of the present disclosure has two ferroelectric layers FFE and BFE, and the two ferroelectric layers FFE and BFE are made of ferroelectric material having hysteresis characteristic. As shown in FIG. 2, wherein FIG. 2 shows a measurement result of the hysteresis characteristics of a ferroelectric material with voltage (V) as the horizontal axis and polarization ($\mu C/cm^2$) as the vertical axis, the polarization at point Pr indicates the remnant polarization, and the electric field at point Ec is the coercive field. That is, the ferroelectric material may be used as the material for the memory device since the ferroelectric material has hysteresis characteristics generated by its special microscopic lattice structure, thereby generating memory effect. The ferroelectric material may be hafnium zirconium oxide (Hf(x)Zr(1−x)O$_2$), lead zirconium titanium (PbZrTi), barium titanate (BaTiO$_3$), hafnium alumina oxide (HfAlO$_2$), etc. The ferroelectric material in the ferroelectric layers may also be replaced by liquid crystal material, the present disclosure is not limited thereto.

Further, in the multi-gate ferroelectric memory M, a silicon oxide layer Si, which may be made of silicon dioxide (SiO$_2$), may be sandwiched between the front ferroelectric layer FFE and the fin-shaped channel layer FIN, and another silicon oxide layer Si, which may also be made of silicon dioxide, may be sandwiched between the back ferroelectric layer BFE and the fin-shaped channel layer FIN, wherein the silicon oxide layer Si between the front ferroelectric layer FFE and the fin-shaped channel layer FIN and the silicon oxide layer Si between the back ferroelectric layer BFE and the fin-shaped channel layer FIN may each be a one-layer structure or a multi-layer structure. In addition, the silicon oxide layer Si may be a selective choice, that is, the front ferroelectric layer FFE of the multi-gate ferroelectric memory M may be directly attached to the fin-shaped channel layer FIN, and the back ferroelectric layer BFE may be directly attached to the fin-shaped channel layer FIN, the present disclosure does not limit whether the multi-gate ferroelectric memory M has silicon oxide layer or not. It should be noted that, the silicon oxide layer Si may be silicon oxide (SiO$_x$), wherein x may be a number from 0 to 2; or, the silicon oxide layer Si may also be a multi-structure stacked with silicon dioxide (SiO$_2$), silicon nitride (Si$_3$N$_4$), hafnium dioxide (HfO$_2$) etc.

The front gate FG and the back gate BG of the multi-gate ferroelectric memory M are not connected to each other. Therefore, the operation of programming, erasing, inhibiting and reading may be completed by applying appropriate bias voltages to the front gate FG and the back gate BG. That is, since the front gate FG and the back gate BG are not connected to each other, the front gate FG and the back gate BG of the multi-gate ferroelectric memory M of the present disclosure may operate independently.

In detail, when an appropriate positive voltage (for example, +5V) is applied to the front gate FG and an appropriate negative voltage (for example, −1V) is applied to the back gate BG, the dipoles of the front ferroelectric layer FFE and the back ferroelectric layer BFE rotate to the same direction due to the positive electric field generated by the front ferroelectric layer FFE and the back ferroelectric layer BFE because of the applied voltage, to complete the writing operation. At the meantime, the threshold voltage of the multi-gate ferroelectric memory M, as measured by sweeping the voltage at the front gate, drops.

After finishing the writing operation, when an appropriate negative voltage (for example, −5V) is applied to the front gate FG and an appropriate low negative voltage (for example, −1V) is applied to the back gate BG, the dipoles of the front ferroelectric layer FFE and the back ferroelectric layer BFE rotate to another direction due to the negative electric field generated by the front ferroelectric layer FFE and the back ferroelectric layer BFE because of the applied voltage, to complete the erasing operation. At the meantime, the threshold voltage of the multi-gate ferroelectric memory M rises.

If the storage state of the multi-gate ferroelectric memory M does not need to be changed, an appropriate positive voltage (for example, +5V) may be applied to the back gate BG to offset the voltage received by the front gate FG to complete the inhibiting operation. At the meantime, the threshold voltage of the multi-gate ferroelectric memory M does not change.

The threshold voltage of the multi-gate ferroelectric memory M may be changed through the operation of rotating the direction of the dipoles as described above. Further, the storage state of the multi-gate ferroelectric memory M may be determined through applying a lower voltage (for example, +1V) to the front gate FG and grounding the back gate BG (to 0V) and determining the threshold voltage of the multi-gate ferroelectric memory M via the channel current, and in turn completing the reading operation.

That is, according to the multi-gate ferroelectric memory M of the present disclosure, since the front gate FG and the back gate BG may operate independently (one memory may have both the function of a selector and storing data), the front gate FG and the back gate BG may be used simultaneously to decide whether to store data (only when applying a positive voltage on the front gate FG and a negative voltage on the back gate BG will data be written). Accordingly, since front gate FG and the back gate BG may operate independently, there is no need for an additional transistor selector to control whether to write or not, and more memory elements (the multi-gate ferroelectric memory M of the present disclosure) may be arranged under the same area.

Figure 3A:
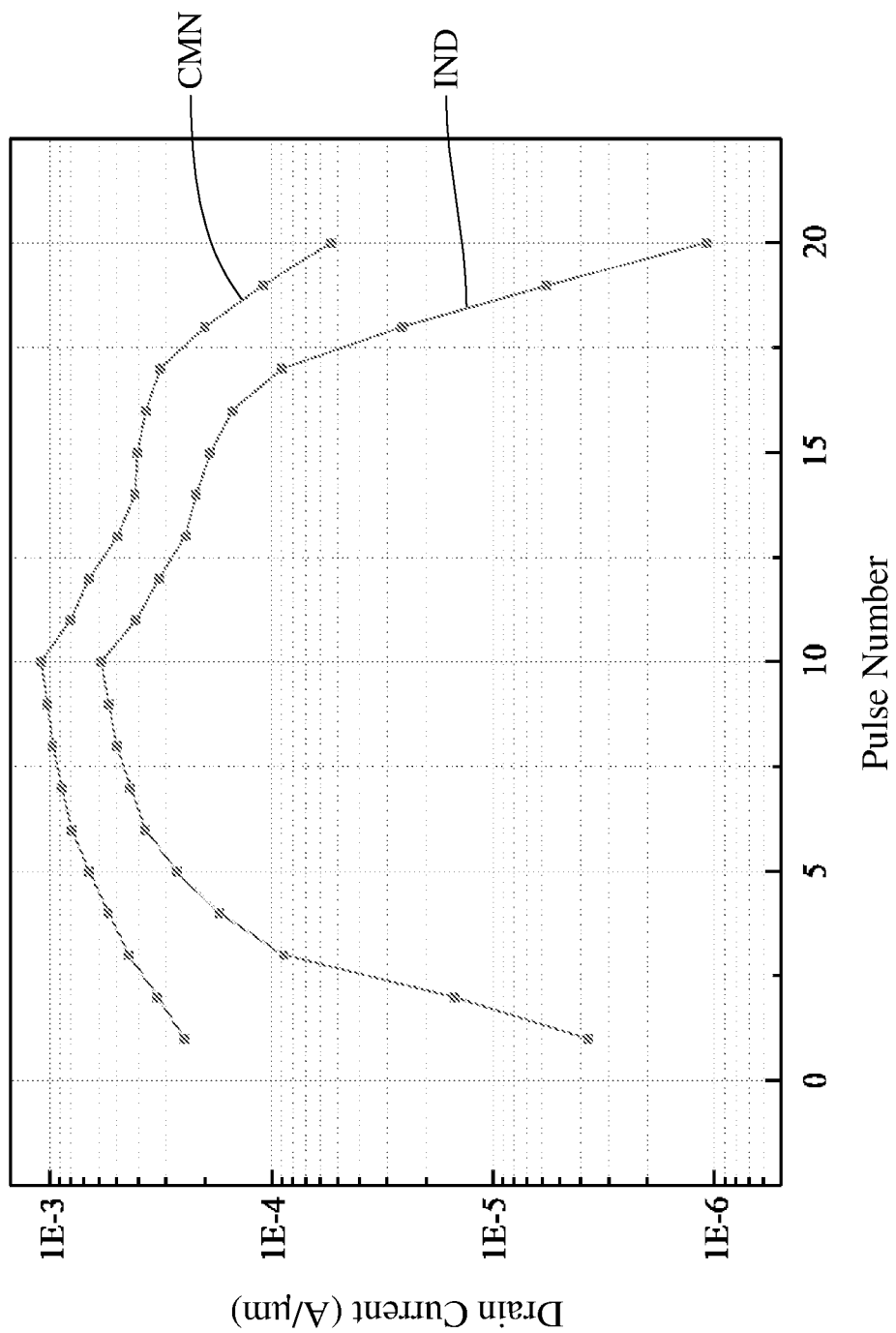
FIGS. 3A and 3B are diagrams of experiment simulation of the multi-gate ferroelectric memory according to the present disclosure.
Figure 3B:
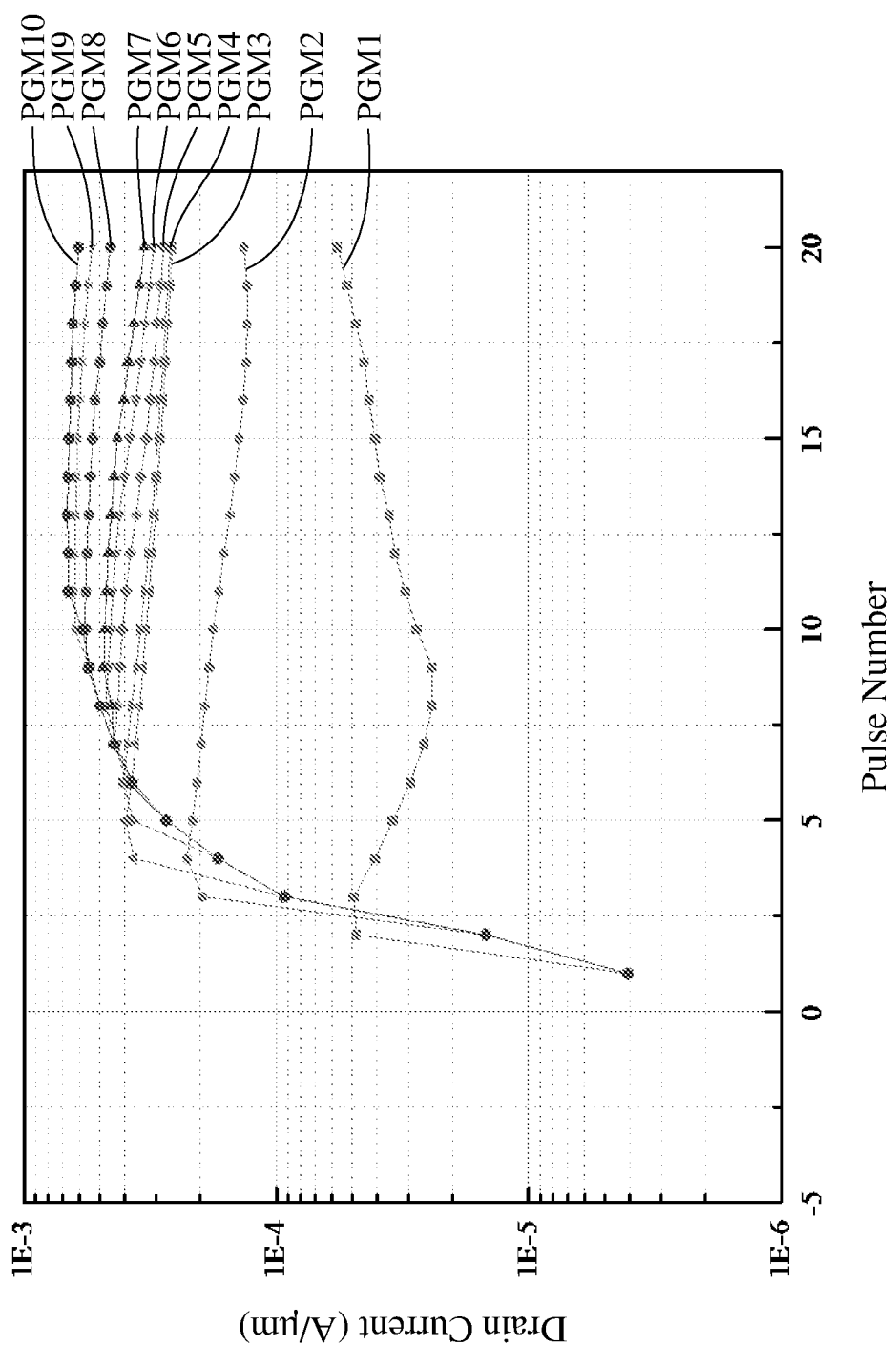

Please refer to FIGS. 3A and 3B, FIGS. 3A and 3B are diagrams of experiment simulation of the multi-gate ferroelectric memory according to the present disclosure. That is, FIGS. 3A and 3B show simulation results generated by technology computer-aided design (TCAD). The curve CMN shown in FIG. 3A is the simulation result of a common single-gate memory, and curve IND is the simulation result of the independent multi-gate ferroelectric memory of the present disclosure, wherein the horizontal axis represents the number of pulses, and the vertical axis is the drain current (A/μm) during reading operation.

Please first refer to FIG. 3A. At the pulse numbers that are less than 10 (the interval that the current increases), the memory is being programmed; and at the pulse number that is over 10 (the interval that the current decreases), the memory is being erased. As shown in FIG. 3A, the current range of the independent multi-gate ferroelectric memory of the present disclosure is significantly larger than that of the common single-gate memory. Therefore, the degree of operation freedom of the memory according to the present disclosure is significantly larger than that of the common single-gate memory, which allows the storage state of the multi-gate ferroelectric memory of the present disclosure to be more recognizable. In addition, the minimum drain current of the common single-gate memory is clearly higher than that of the multi-gate ferroelectric memory of the present disclosure. Therefore, the multi-gate ferroelectric memory of the present disclosure may greatly lower the power consumption of the memory during operation.

Please then refer to FIG. 3B. FIG. 3B shows "programming then inhibiting" simulation, wherein pulse numbers of 0~(N−1) represent applying program voltage to the back gate, and pulse numbers of N~20 represent applying inhibiting voltage to the back gate, where N is the number of programming. Curves PGM1~PGM10 respectively represent the simulation cases with different N's. Specifically, PGM1 represents the case wherein number of programming is 1; PGM2 represents the case wherein number of programming is 2, and so on. For example, curve PGM2 in the range of pulse number from 0 to 2 represents the drain current in the situation where a voltage of "−1V" is applied to the back gate to change the storage state of the memory, and curve PGM2 in the range of pulse number from 3 to 20 represents the drain current in the situation where an inhibition voltage of "+5V" is applied to the back gate. Subsequently, no matter the front gate receives an input voltage for programming or erasing, the stored data (value) may still be preserved. That is, FIG. 3B shows the fine program-inhibiting mode of the independent multi-gate ferroelectric memory of the present disclosure. Since the present disclosure has the mechanism of controlling whether to program or not by the back gate independently, the area of the multi-gate ferroelectric memory of the present disclosure may be smaller than that of the common single-gate memory, as no selection transistor is required for each memory cell.

Please refer to FIG. 1 as well as FIGS. 4A to 4E, FIGS. 4A to 4E are schematic diagrams of the process of forming the multi-gate ferroelectric memory of the present disclosure. As described above, the silicon oxide layer Si of the multi-gate ferroelectric memory may be omitted, and the schematic diagrams of forming the multi-gate ferroelectric memory shown in FIGS. 4A to 4E omit the process of disposing the silicon oxide layer Si.

Figure 4A:
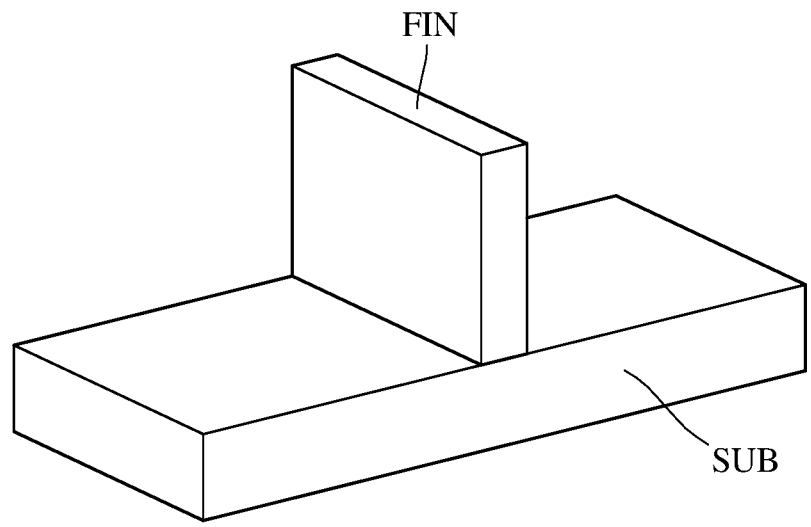
FIGS. 4A to 4E are schematic diagrams of the process of forming the multi-gate ferroelectric memory of the present disclosure.

Please refer to FIG. 4A, the process of forming the multi-gate ferroelectric memory M of the present disclosure may be first generating the fin-shaped channel layer FIN on a substrate SUB through lithography and etching.

Figure 4B:
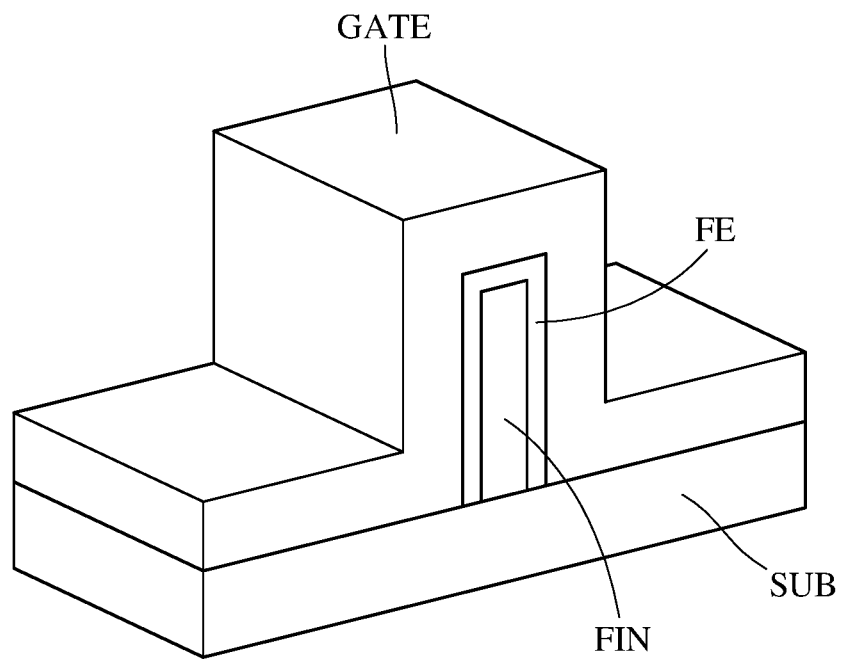

Please refer to FIG. 4B, hafnium zirconium dioxide (HfZrO$_2$) and titanium nitride (TiN) (or other materials described above that are suitable for forming the gate) are then deposited respectively through atomic layer deposition (ALD) and physical vapor deposition (PVD) to form a ferroelectric layer FE and a gate GATE. The titanium nitride (TiN) may also be deposited through ALD. The present disclosure does not limit the ways of forming HfZrO$_2$ and TiN.

Figure 4C:
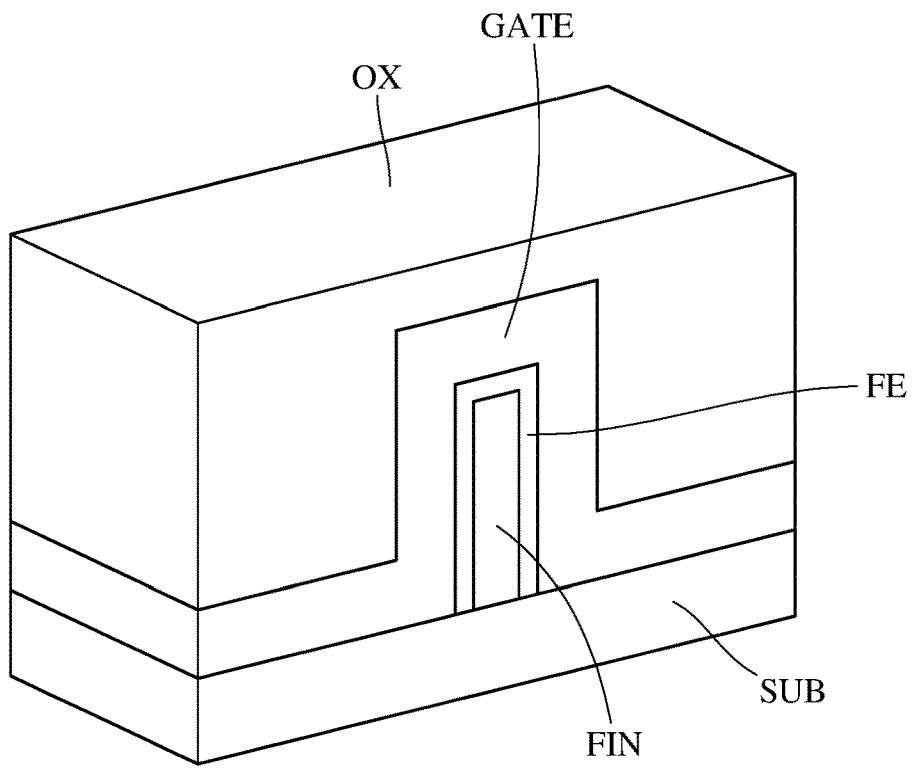

Please refer to FIG. 4C, after forming the ferroelectric layer FE and the gate GATE, a flowable oxide OX is used to fill the interspace around the fin-shaped channel layer FIN, wherein the flowable oxide OX is preferably silicon oxide.

Figure 4D:
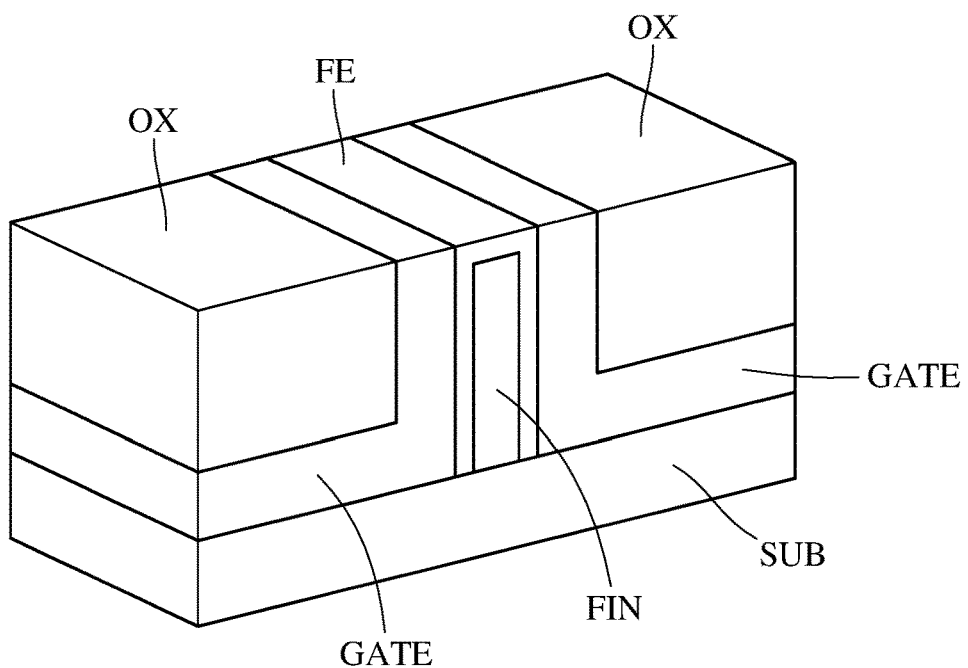
Figure 4E:
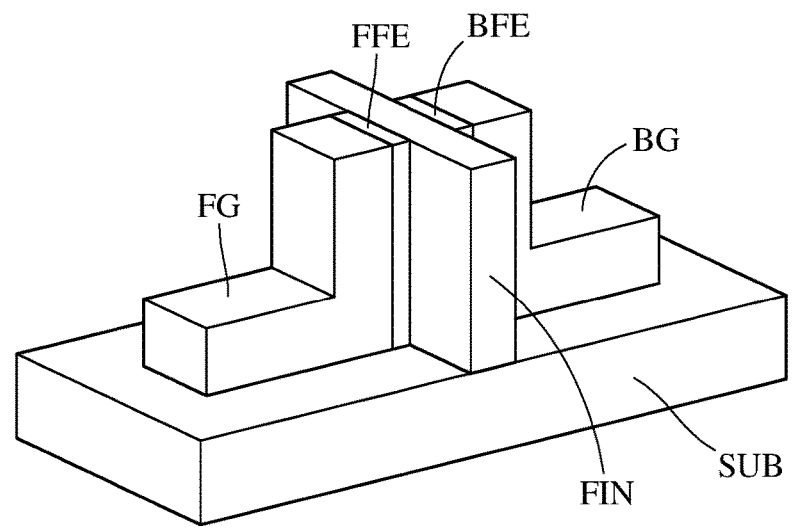

Please then refer to FIGS. 4D and 4E, the gate GATE is separated into the front gate FG and the back gate BG, and the ferroelectric layer FE is separated into the front ferroelectric layer FFE and the back ferroelectric layer BFE through reactive ion etching (RIE). A buffered oxide etchant (BOE) is applied to remove the flowable oxide OX. The shapes of the front gate FG and the back gate BG is defined through lithography and etching to form the multi-gate ferroelectric memory M. The front gate FG may be seen as the front of the multi-gate ferroelectric memory M, and the back gate BG may be seen as the back of the multi-gate ferroelectric memory M, and the multi-gate ferroelectric memory M preferably has a sagittal symmetric structure.

Figure 5:
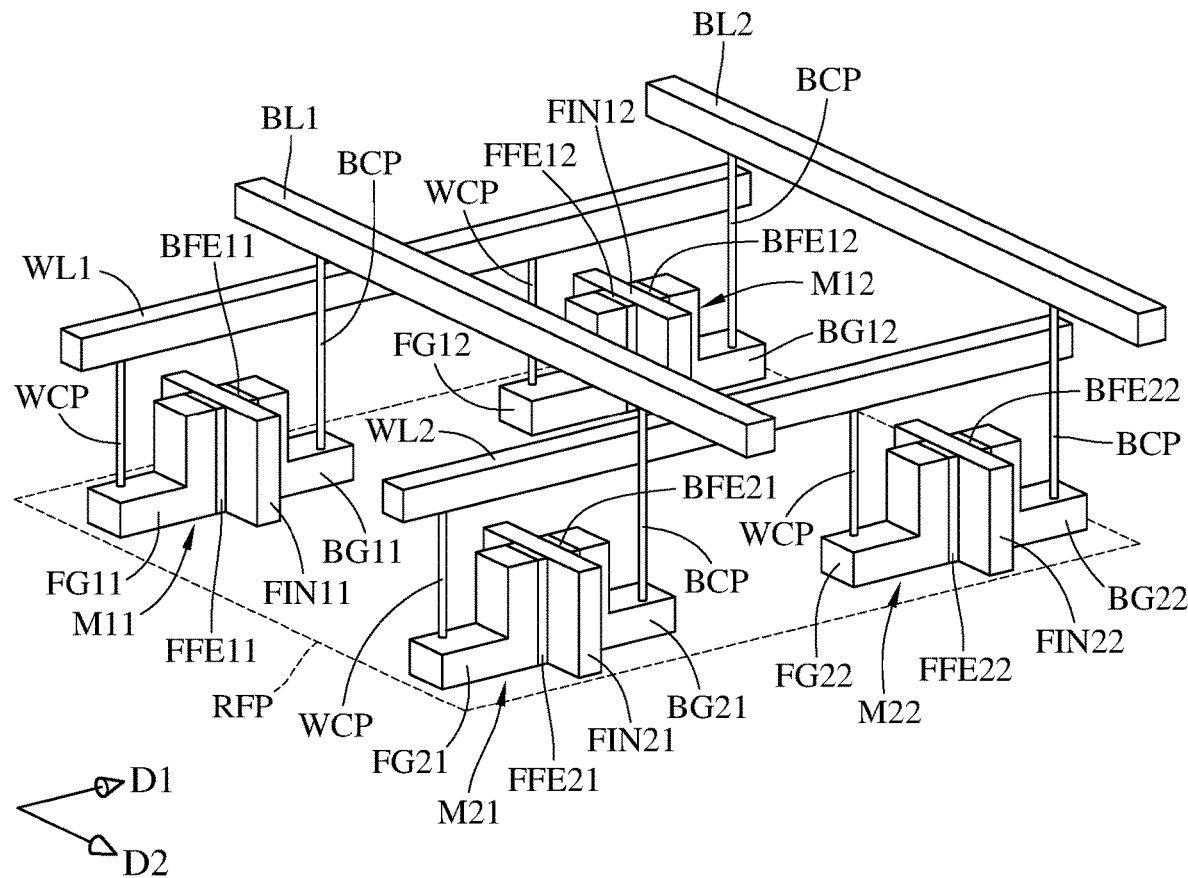
FIG. 5 is a schematic diagram of the memory array device according to an embodiment of the present disclosure.

Please refer to both FIG. 1 and FIG. 5, wherein FIG. 5 is a schematic diagram of the memory array device according to an embodiment of the present disclosure. That is, the memory array device comprises a plurality of the multi-gate ferroelectric memories M11, M12, M21 and M22, a plurality of word lines WL1 and WL2 and a plurality of bit lines BL1 and BL2, wherein the multi-gate ferroelectric memories M11, M12, M21 and M22 are arranged as an array. The multi-gate ferroelectric memories M11 and M12 (or the multi-gate ferroelectric memories M21 and M22) are arranged along a first direction D1 of the array, the multi-gate ferroelectric memories M11 and M21 (or the multi-gate ferroelectric memories M12 and M22) are arranged along a second direction D2 of the array, and the first direction D1 and the second direction D2 intersects. The multi-gate ferroelectric memories M11, M12, M21 and M22 are coplanar on a reference plane RFP, and in this embodiment, the word lines WL1 and WL2 as well as the bit lines BL1 and BL2 are on the same side of the reference plane RFP.

The multi-gate ferroelectric memory M11 has a front gate FG11, a back gate BG11, a front ferroelectric layer FFE11 and a back ferroelectric layer BFE11, and a fin-shaped channel layer FIN11 is sandwiched between the two ferroelectric layers FFE11 and BFE11; the multi-gate ferroelectric memory M12 has a front gate FG12, a back gate BG12, a front ferroelectric layer FFE12 and a back ferroelectric layer BFE12, and a fin-shaped channel layer FIN12 is sandwiched between the two ferroelectric layers FFE12 and BFE12; the multi-gate ferroelectric memory M21 has a front gate FG21, a back gate BG21, a front ferroelectric layer FFE21 and a back ferroelectric layer BFE21, and a fin-shaped channel layer FIN21 is sandwiched between the two ferroelectric layers FFE21 and BFE21; the multi-gate ferroelectric memory M22 has a front gate FG22, a back gate BG22, a front ferroelectric layer FFE22 and a back ferroelectric layer BFE22, and a fin-shaped channel layer FIN22 is sandwiched between the two ferroelectric layers FFE22 and BFE22.

Each one of the word lines WL1 and WL2 is connected to the front gates of a part of the multi-gate ferroelectric memories M11, M12, M21 and M22, and the part of the multi-gate ferroelectric memories connected to the same one of the word lines WL1 and WL2 are arranged along the first direction D1 of the array (for example, the multi-gate ferroelectric memories M11 and M12 connecting the word line WL1 as shown in FIG. 5); and each one of the bit lines BL1 and BL2 is connected to the back gates of part of the multi-gate ferroelectric memories M11, M12, M21 and M22, and the part of the multi-gate ferroelectric memories connected to the same one of the bit lines BL1 and BL2 are arranged along the second direction D2 of the array (for example, the multi-gate ferroelectric memories M11 and M21 connecting the bit line BL1 as shown in FIG. 5). One of the part of the multi-gate ferroelectric memories connected to the same word line WL1 or WL2 and one of the part of the multi-gate ferroelectric memories connected to the same bit line BL1 or BL2 are the same multi-gate ferroelectric memory (for example, the multi-gate ferroelectric memory M11 connecting the word line WL1 and the bit line BL1 as shown in FIG. 5).

In detail, the word line WL1 is connected to the front gate FG11 of the multi-gate ferroelectric memory M11 and the front gate FG12 of the multi-gate ferroelectric memory M12 through word conductive pillars WCP; and the word line WL2 is connected to the front gate FG21 of the multi-gate ferroelectric memory M21 and the front gate FG22 of the multi-gate ferroelectric memory M22 through word conductive pillars WCP. The bit line BL1 is connected to the back gate BG11 of the multi-gate ferroelectric memory M11 and the back gate BG21 of the multi-gate ferroelectric memory M21 through bit conductive pillars BCP; and the bit line BL2 is connected to the back gate BG12 of the multi-gate ferroelectric memory M12 and the back gate BG22 of the multi-gate ferroelectric memory M22 through bit conductive pillars BCP.

Accordingly, as described above, by respectively applying appropriate bias voltages to the front gates FG11~FG22 and the back gates BG11~BG22, the operation of programming, erasing, inhibiting and reading may be completed. For example, in the multi-gate ferroelectric memories M11, M12, M21 and M22, if only the storage state of the multi-gate ferroelectric memory M12 needs to be changed, appropriate voltages may be applied to the front gate FG12 and the back gate BG12 of the multi-gate ferroelectric memory M12 through the word line WL1 and the bit line BL2 to alter the storage state of the multi-gate ferroelectric memory M12, and the storage states of other multi-gate ferroelectric memories M11, M21 and M22 are not affected. In other words, since the front gate and the back gate may operate independently, the front gate of the multi-gate ferroelectric memory may be used to write the data to be stored, and the back gate may be used as the control end for selecting the multi-gate ferroelectric memory. The storage state of the multi-gate ferroelectric memory may then be changed.

Figure 6:
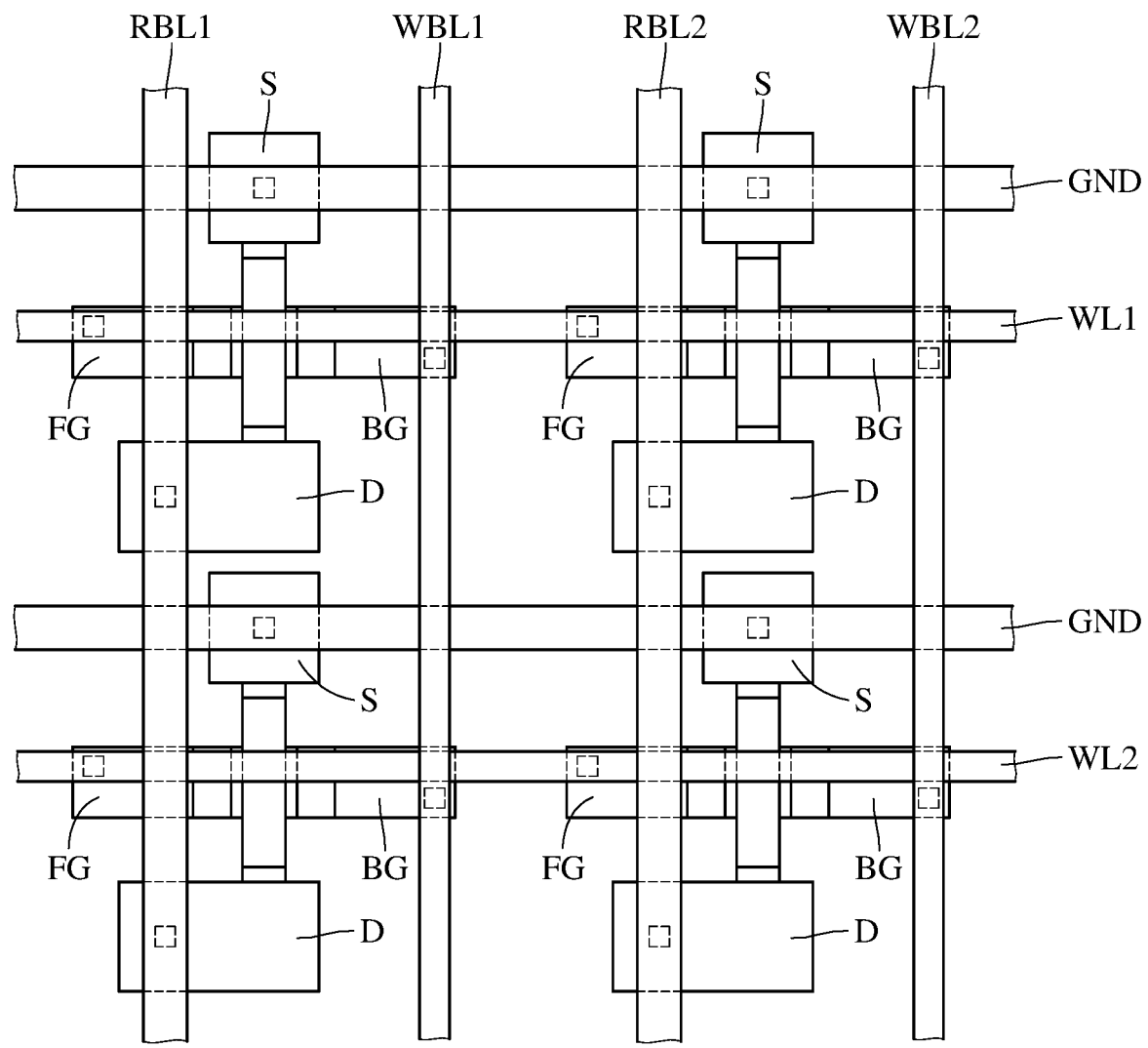
FIG. 6 is a layout diagram of the memory array device according to an embodiment of the present disclosure.

Please refer to FIG. 6, wherein FIG. 6 is a layout diagram of the memory array device according to an embodiment of the present disclosure. Specifically, each front gate FG is connected to the corresponding word line (for example, word line WL1 or WL2); and each back gate BG is connected to the corresponding bit line (for example, bit line BL1 or BL2). Each source S of each multi-gate ferroelectric memory is connected to the ground GND; and each drain D of each multi-gate ferroelectric memory is connected to a data line (for example, data lines RBL1 and RBL2), for transmitting the voltage signal under reading mode to the corresponding drain D. Namely, since each one of the multi-gate ferroelectric memories of the present disclosure may be operated independently without using another component (for example, a transistor) as a selector, the arrangement density of the memory array device may be increased when arranging the layout of the multi-gate ferroelectric memories. In the known layout of the memory array device, each memory requires a selector and a memory; on the other hand, the present disclosure (as shown in FIG. 6) uses one word line to connect the front gates in the same row and uses one bit line to connect the back gate to in the same column.

Therefore, comparing to the known memory array device, the memory array device of the present disclosure may lower the amount of transistors in the memory array device, to further lower the overall size and cost of the memory array device.

Figure 7:
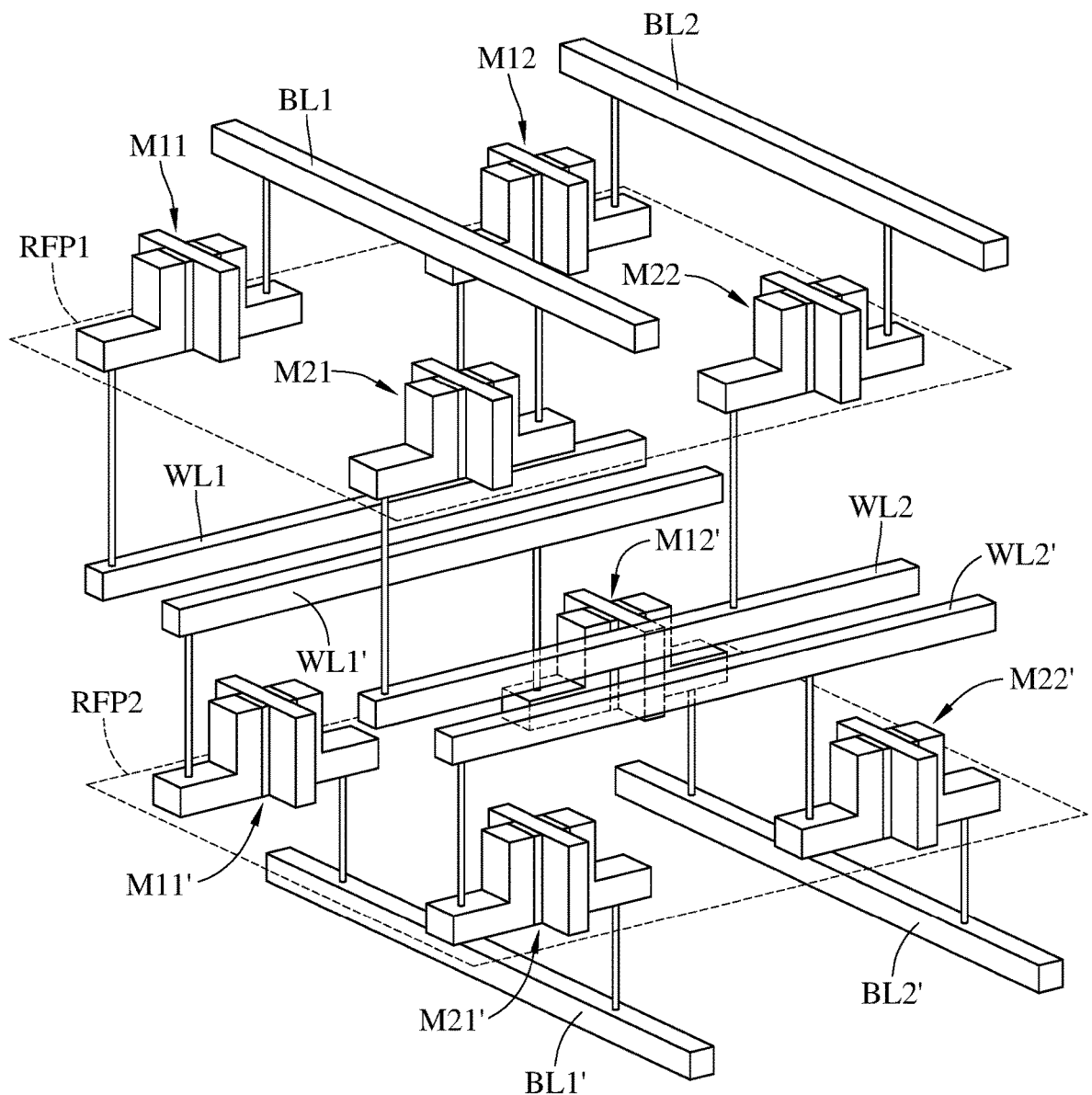
FIG. 7 is another schematic diagram of the memory array device according to another embodiment of the present disclosure.

Please then refer to FIG. 7, wherein FIG. 7 is another schematic diagram of the memory array device according to another embodiment of the present disclosure. For description purpose, the multi-gate ferroelectric memories M11, M12, M21 and M22 will be referred to as first multi-gate ferroelectric memories M11, M12, M21 and M22; the word lines WL1 and WL2 will be referred to as first word lines WL1 and WL2; bit lines BL1 and BL2 will be referred to as first bit lines BL1 and BL2; and the first multi-gate ferroelectric memories M11, M12, M21 and M22 are coplanar on a first reference plane RFP1. The memory array device further comprises second word lines WL1' and WL2'; second bit lines BL1' and BL2'; and a plurality of second multi-gate ferroelectric memories M11', M12', M21' and M22', wherein the second multi-gate ferroelectric memories M11', M12', M21' and M22' are coplanar on a second reference plane RFP2. In this embodiment, the first word lines WL1 and WL2 and the second word lines WL1' and WL2' are located between the first reference plane RFP1 and the second reference plane RFP2. The first bit lines BL1 and BL2 are located on another side of the first reference plane RFP1 which is different from the side the first word lines WL1 and WL2 located on, and the second bit lines BL1' and BL2' are located on another side of the second reference plane RFP2 which is different from the side the first bit lines BL1 and BL2 located on.

The structures of the second multi-gate ferroelectric memories M11', M12', M21' and M22' are the same as the structures of the first multi-gate ferroelectric memories M11, M12, M21 and M22. Similar to FIG. 5, each front gate of the second multi-gate ferroelectric memories M11', M12', M21' and M22' is connected to the corresponding word line through the word conductive pillar, and each back gate of the second multi-gate ferroelectric memories M11', M12', M21' and M22' is connected to the corresponding bit line through the bit conductive pillar, wherein the detail description of the second multi-gate ferroelectric memories M11', M12', M21' and M22' will not be repeated herein.

According to the embodiment of FIG. 7, the first word lines WL1 and WL2 and the second word lines WL1' and WL2' connected to the first multi-gate ferroelectric memories M11, M12, M21 and M22 and the second multi-gate ferroelectric memories M11', M12', M21' and M22' are located on the same layer. Therefore, when multi-layers of the multi-gate ferroelectric memories are needed to form a memory array device, the entire size of the memory array device may be lowered.

Figure 8:
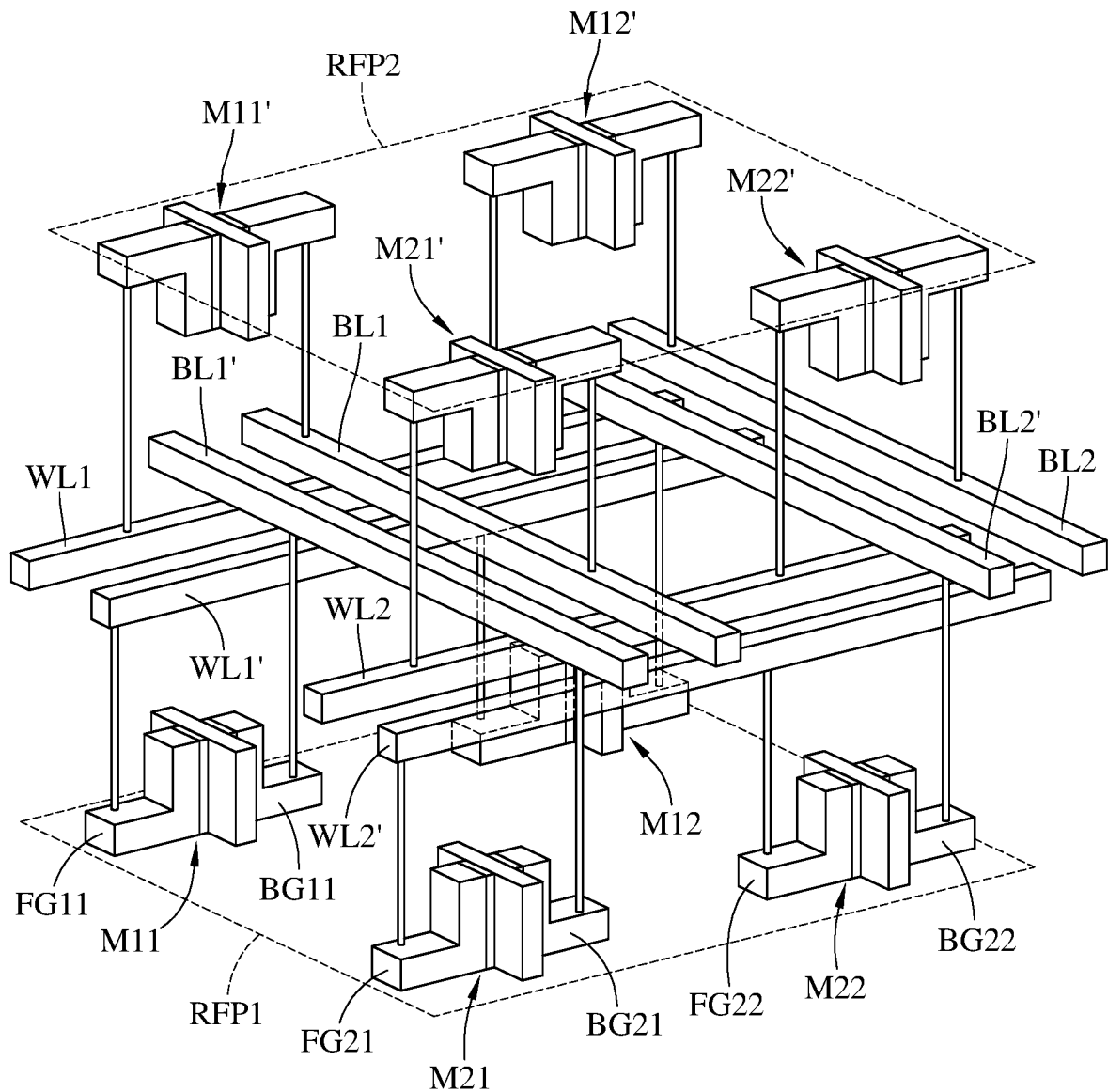
FIG. 8 is yet another schematic diagram of the memory array device according to another embodiment of the present disclosure.

Please refer to FIG. 8, wherein FIG. 8 is yet another schematic diagram of the memory array device according to another embodiment of the present disclosure. The elements of the memory array device of FIG. 8 are the same as that of FIG. 7, so the detail description of FIG. 8 will not be repeated herein. The difference between FIG. 7 and FIG. 8 lies in that the first word lines WL1 and WL2, the second word lines WL1' and WL2', the first bit lines BL1 and BL2, and the second bit lines BL1' and BL2' of the memory array device of FIG. 8 are located between the first reference plane RFP1 and the second reference plane RFP2.

As shown in FIG. 8, the first multi-gate ferroelectric memories M11, M12, M21 and M22 are respectively connected to the corresponding first word lines WL1 and WL2 and bit lines BL1 and BL2; and the second multi-gate ferroelectric memories M11', M12', M21' and M22' are respectively connected to the corresponding second word lines WL1' and WL2' and bit lines BL1' and BL2'. The size of the memory array device may be lowered.

It should be noted that, in the embodiments of FIGS. 7 and 8, by applying appropriate voltages to the corresponding word line and bit line (the detail implementation is described above), the storage state of one or more multi-gate ferroelectric memory may be simultaneously altered without affecting the storage state of other multi-gate ferroelectric memories, meaning each multi-gate ferroelectric memory may operate independently.

Please refer to FIGS. 9 to 12, wherein FIGS. 9 to 12 are schematic diagrams of the memory array device according to embodiments of the present disclosure, wherein the elements of the memory array devices shown in FIGS. 9 to 12 are similar to that of FIG. 7, the detail description of the structures of the memory array devices will not be repeated herein. the embodiments of FIGS. 9 to 12 only comprise one set of bit lines (BL1 and BL2) or one set of word line (WL1 and WL2).

Figure 9:
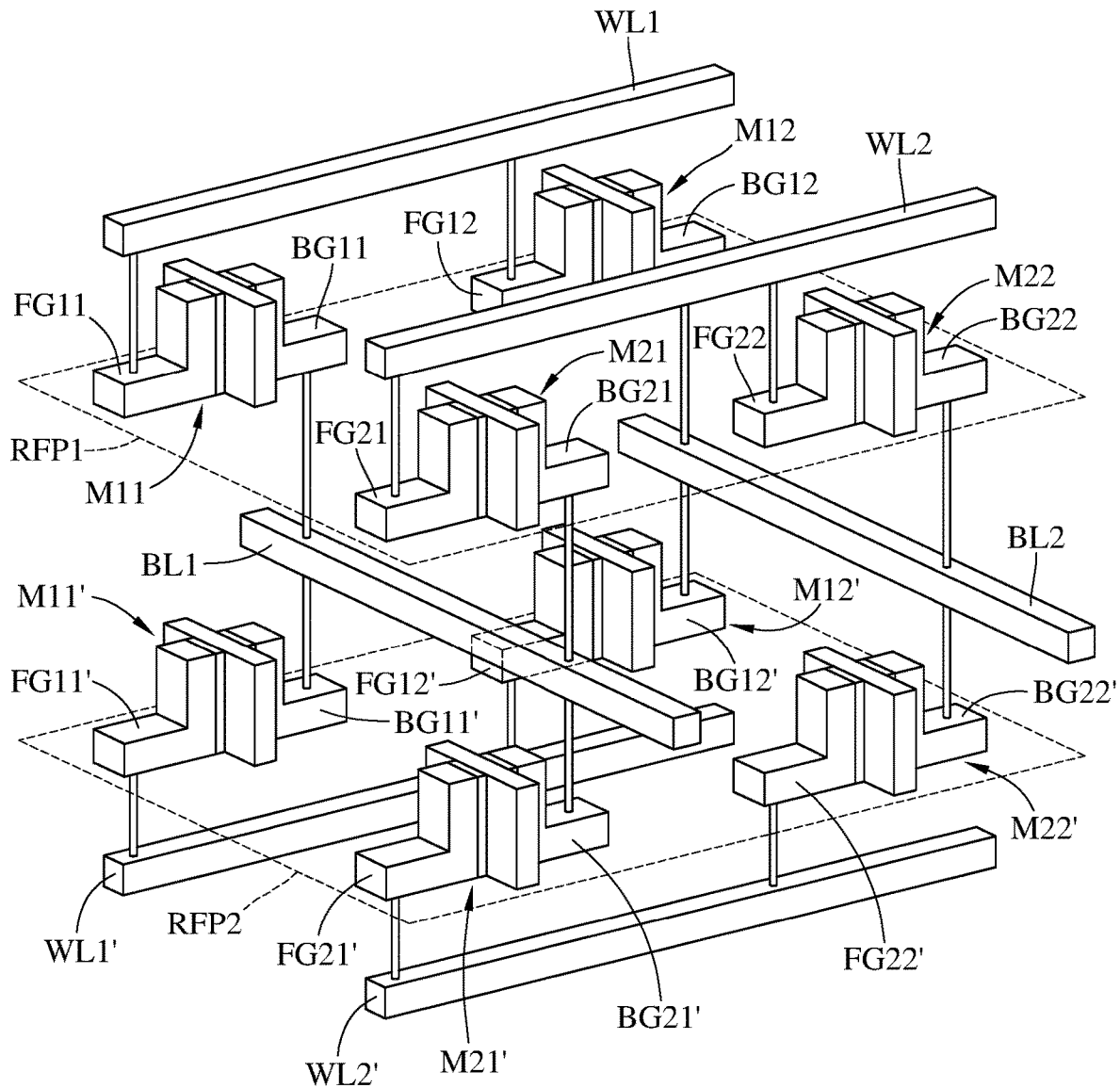
FIGS. 9 to 12 are schematic diagrams of the memory array device according to embodiments of the present disclosure.

The first word lines WL1 and WL2 and bit lines BL1 and BL2 of the memory array device shown in FIG. 9 are respectively disposed on two sides of the first reference plane RFP1, and the first bit lines BL1 and BL2 and the second word lines WL1' and WL2' are respectively disposed on two sides of the second reference plane RFP2. That is, the bit lines BL1 and BL2 are located between the first reference plane RFP1 and the second reference plane RFP2, and the first word lines WL1 and WL2 are located on another side of the first reference plane RFP1 which is different from the side the bit lines BL1 and BL2 are located on, and the second word lines WL1' and WL2' are located on another side of the second reference plane RFP2 which is different from the side the bit lines BL1 and BL2 are located on. Therefore, the first multi-gate ferroelectric memories M11, M12, M21 and M22 and the second multi-gate ferroelectric memories M11', M12', M21' and M22' may share the bit lines BL1 and BL2 to lower the size of the memory array device.

Figure 10:
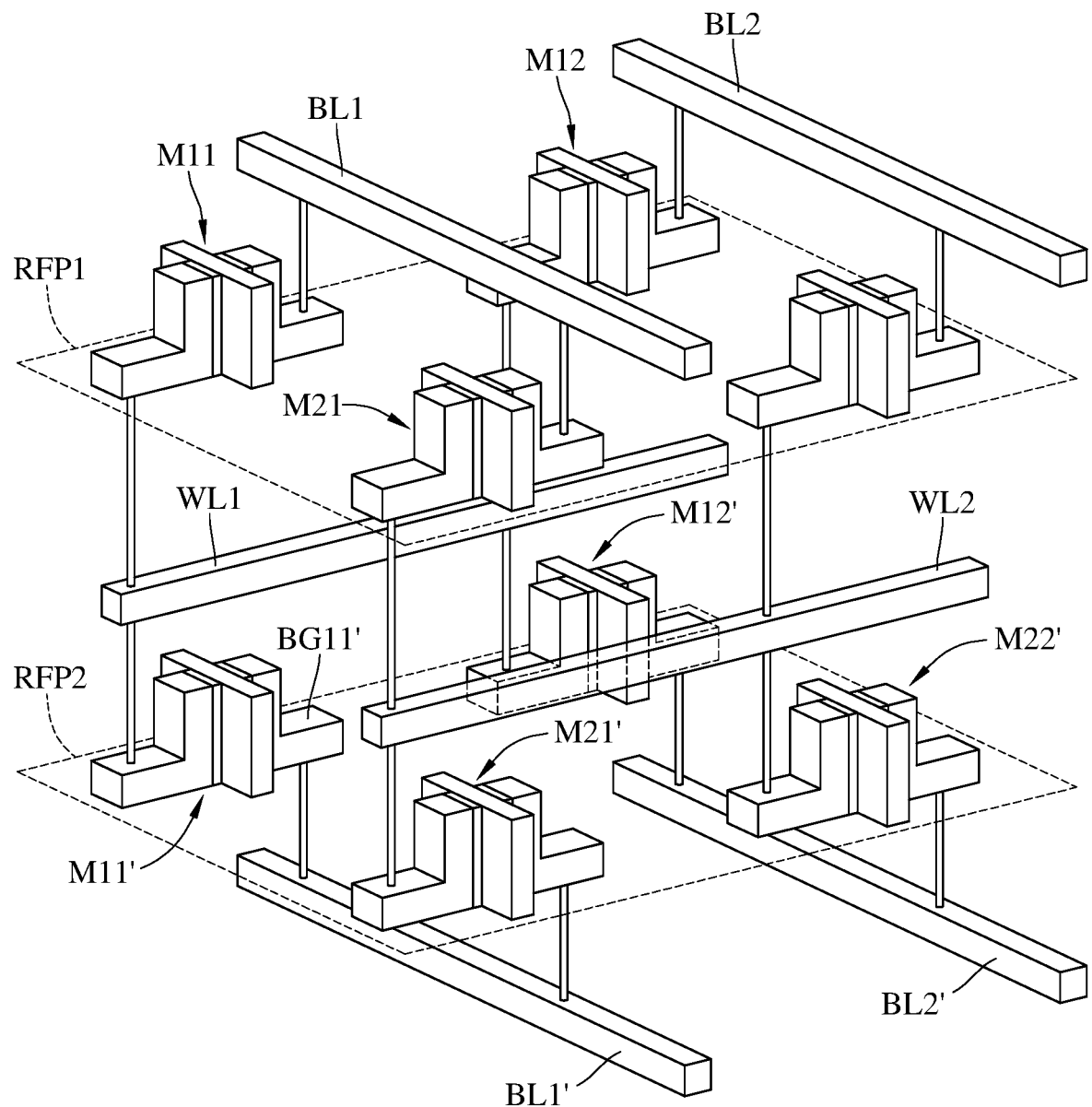

In the embodiment of FIG. 10, the first bit lines BL1 and BL2 and the word lines WL1 and WL2 are respectively disposed on the two sides of the first reference plane RSF1, and the word lines WL1 and WL2 and the second bit lines BL1' and BL2' are disposed on the two sides of the second reference plane RFP2. Therefore, the first multi-gate ferroelectric memories M11, M12, M21 and M22 and the second multi-gate ferroelectric memories M11', M12', M21' and M22' may respectively connect the first bit lines BL1 and BL2 and the second bit lines BL1' and BL2'. Further, the multi-gate ferroelectric memories M11, M12, M11' and M12' share the word line WL1, and the multi-gate ferroelectric memories M21, M22, M21' and M22' share the word line WL2.

Figure 11:
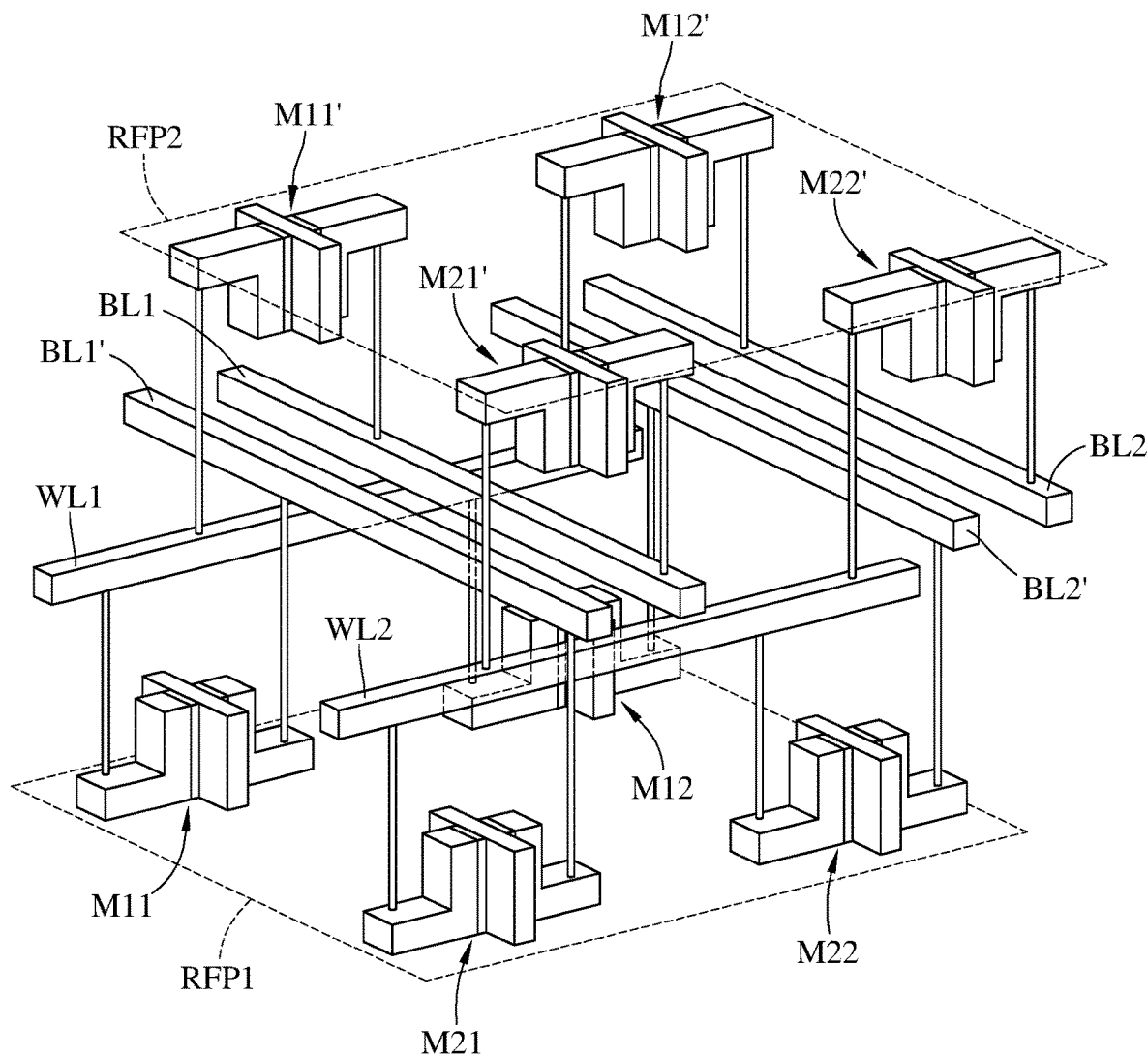

Please refer to FIG. 11, the memory array device shown in FIG. 11 is similar to that of FIG. 8, the difference between FIG. 8 and FIG. 11 lies in that the memory array device shown in FIG. 11 has one set of word lines WL1 and WL2 and two sets of bit lines (the first bit lines BL1 and BL2 and the second bit lines BL1' and BL2'). The word lines WL1 and WL2, the first bit lines BL1 and BL2 and the second bit lines BL1' and BL2' are located between the first reference plane RFP1 and the second reference plane RFP2.

As shown in FIG. 11, the first multi-gate ferroelectric memories M11, M12, M21 and M22 and the second multi-gate ferroelectric memories M11', M12', M21' and M22' respectively connect to the corresponding first bit lines BL1 and BL2 and the second bit lines BL1' and BL2'. The multi-gate ferroelectric memories M11, M12, M11' and M12' share the word line WL1, and the multi-gate ferroelectric memories M21, M22, M21' and M22' share the word line WL2 to lower the size of the memory array device.

Figure 12:
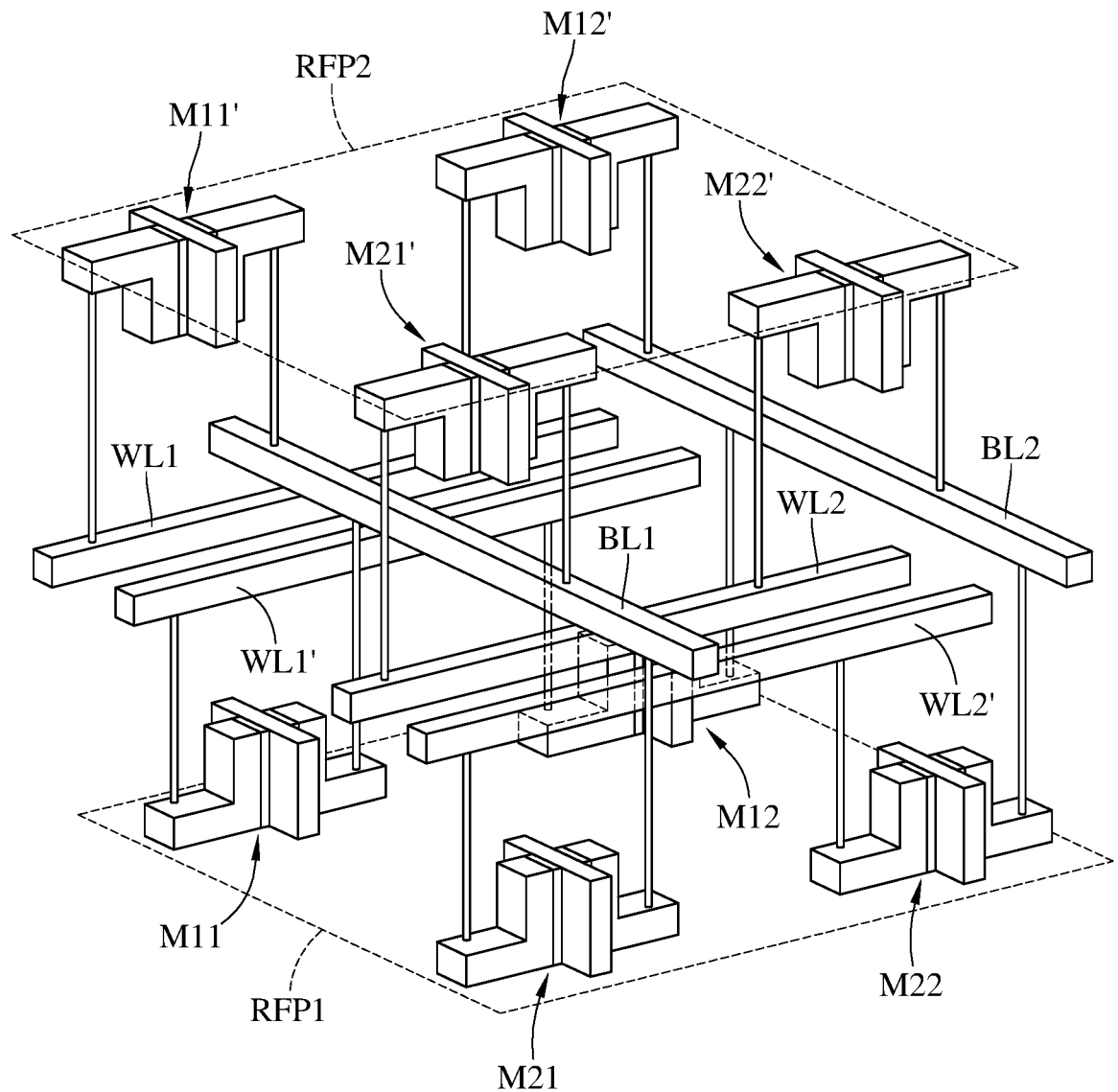

Please refer to FIG. 12. The memory array device shown in FIG. 12 is similar to that of FIG. 11, the difference between FIG. 11 and FIG. 12 lies in that the memory array device shown in FIG. 12 has one set of bit lines BL1 and BL2 and two sets of word lines (the first word lines WL1 and WL2 and the second word lines WL1' and WL2'). The bit lines BL1 and BL2, the first word lines WL1 and WL2 and the second word lines WL1' and WL2' are all located between the first reference plane RFP1 and the second reference plane RFP2. Therefore, the multi-gate ferroelectric memories M11, M21, M11' and M21' share the bit line BL1, and the multi-gate ferroelectric memories M12, M22, M12' and M22' share the bit line BL2 to lower the size of the memory array device.

Different from FIG. 7 and FIG. 8, the memory array devices shown in FIGS. 9 to 12 change the storage state of one multi-gate ferroelectric memory at a time. With the embodiments of FIGS. 9 to 12, the size and cost of the memory array device may be lowered.

It should be noted that, the amount of the multi-gate ferroelectric memories and the arrangement of the array shown in FIGS. 5 to 12 are merely examples, the present disclosure does not limit the amount and arrangement of the multi-gate ferroelectric memories. Further, the memory array devices shown in FIGS. 5 to 12 are preferably implemented with the manufacturing process of wafer bonding.

The multi-gate ferroelectric memory and the memory array device of the present disclosure may be applied to neuromorphic and deep learning of the artificial intelligence (AI) field. Due to the characteristics of AI technology, AI has to be trained using weight values, wherein the weight values rely on the storage of the memory array device for AI to finish training. The memory array device may first finish the calculation of weight values internally to overcome the data transmission (so called "von Neumann bottleneck") between the central processing unit (CPU) and memory device of the computer. The multi-gate ferroelectric memory and the memory array device of the present disclosure allows reducing the size/area of the memory array device, to further increase the arrangement density and have higher storage ability, which is more suitable for the application of AI technology.

In view of the above description, according to the multi-gate ferroelectric memory and the memory array device of the present disclosure, the storage state of the memory may be selectively changed by only using one element, and the size and cost of the memory array device may be reduced. Further, more memory may be disposed under the same area, and at the same time a larger storage space may be generated to store more data. Each of the memory in the memory array device may operate independently. In addition, with the ferroelectric material, the storage state of the memory may be altered faster, and the memory may operate under a lower working voltage.

What is claimed is:
1. A multi-gate ferroelectric memory, comprising:
a fin-shaped channel layer;
a front ferroelectric layer disposed on one side of the fin-shaped channel layer;
a back ferroelectric layer disposed on another side of the fin-shaped channel layer;

a front gate attached to the front ferroelectric layer and away from the fin-shaped channel layer, wherein the front gate is configured to connect a word line; and a back gate attached to the back ferroelectric layer and away from the fin-shaped channel layer, wherein the back gate is configured to connect a bit line.

2. The multi-gate ferroelectric memory according to claim 1, wherein the front ferroelectric layer and the back ferroelectric layer are made of ferroelectric material having hysteresis characteristic.

3. The multi-gate ferroelectric memory according to claim 1, wherein the front gate and the back gate contain at least one of titanium nitride and tantalum nitride.

4. The multi-gate ferroelectric memory according to claim 1, wherein a silicon oxide layer is sandwiched between the front ferroelectric layer and the fin-shaped channel layer, and another silicon oxide layer is sandwiched between the back ferroelectric layer and the fin-shaped channel layer.

5. A memory array device, comprising:
a plurality of multi-gate ferroelectric memories of claim 1 arranged as an array;
a plurality of word lines, with each of the word lines connecting the front gates of part of the multi-gate ferroelectric memories, wherein the part of the multi-gate ferroelectric memories connected to a same one of the word lines is arranged along a first direction of the array; and
a plurality of bit lines, with each of the bit lines connecting the back gates of part of the multi-gate ferroelectric memories, wherein the part of the multi-gate ferroelectric memories connected to a same one of the bit lines is arranged along a second direction of the array.

6. The memory array device according to claim 5, wherein an amount of the word lines is smaller than an amount of the multi-gate ferroelectric memories, and an amount of the bit lines are smaller than the amount of the multi-gate ferroelectric memories.

7. The memory array device according to claim 5, wherein the front ferroelectric layers and the back ferroelectric layers of the multi-gate ferroelectric memories are made of ferroelectric material having hysteresis characteristic.

8. The memory array device according to claim 5, wherein the first direction intersects the second direction.

9. The memory array device according to claim 5, wherein the multi-gate ferroelectric memories are coplanar on a reference plane, and the word lines and the bit lines are located on the same side of the reference plane.

10. The memory array device according to claim 9, wherein the words lines are a plurality of first word lines, the bit lines are a plurality of first bit lines, the multi-gate ferroelectric memories are a plurality of first multi-gate ferroelectric memories, the reference plane is a first reference plane, and the memory array device further comprises a plurality of second word lines, a plurality of second bit lines and a plurality of second multi-gate ferroelectric memories, and
the second multi-gate ferroelectric memories are coplanar on a second reference plane, a plurality of second front gates of the second multi-gate ferroelectric memories are connected to the second word lines, a plurality of second back gates of the second multi-gate ferroelectric memories are connected to the second bit lines, wherein the first word lines, the second word lines, the first bit lines and the second bit lines are located between the first reference plane and the second reference plane.

11. The memory array device according to claim 5, wherein the multi-gate ferroelectric memories are coplanar on a reference plane, and the word lines and the bit lines are located on two sides of the reference plane.

12. The memory array device according to claim 10, wherein the word lines are a plurality of first word lines, the bit lines are a plurality of first bit lines, the multi-gate ferroelectric memories are a plurality of first multi-gate ferroelectric memories, the reference plane is a first reference plane, and the memory array device further comprises a plurality of second word lines, a plurality of second bit lines and a plurality of second multi-gate ferroelectric memories, and
the second multi-gate ferroelectric memories are coplanar on a second reference plane, a plurality of second front gates of the second multi-gate ferroelectric memories are connected to the second word lines, a plurality of second back gates of the second multi-gate ferroelectric memories are connected to the second bit lines, wherein the first word lines and the second word lines are located between the first reference plane and the second reference plane, the first bit lines are located on a side of the first reference plane which is different from another side of the first reference plane which the first word lines located on, and the second bit lines are located on a side of the second reference plane which is different from another side of the second reference plane which the second word lines located on.

13. The memory array device according to claim 11, wherein the multi-gate ferroelectric memories are a plurality of first multi-gate ferroelectric memories, the word lines are a plurality of first word lines, the reference plane is a first reference plane, and the memory array device further comprises a plurality of second multi-gate ferroelectric memories and a plurality of second word lines, and
the second multi-gate ferroelectric memories are coplanar on a second reference plane, a plurality of second front gates of the second multi-gate ferroelectric memories are connected to the second word lines, a plurality of second back gates of the second multi-gate ferroelectric memories are connected to the bit lines, wherein the bit lines are located between the first reference plane and the second reference plane, the first word lines are located on a side of the first reference plane which is different from another side of the first reference plane which the bit lines located on, and the second word lines are located on a side of the second reference plane which is different from another side of the second reference plane which the second word lines located on.

* * * * *